United States Patent
Lim

(10) Patent No.: US 8,901,992 B1
(45) Date of Patent: Dec. 2, 2014

(54) TEMPERATURE SENSORS

(71) Applicant: SK Hynix Inc., Icheon-si Gyeonggi-do (KR)

(72) Inventor: Hee Joon Lim, Cheongju-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/193,009

(22) Filed: Feb. 28, 2014

(30) Foreign Application Priority Data

Sep. 30, 2013 (KR) .................. 10-2013-0116212

(51) Int. Cl.
*G01K 7/00* (2006.01)
*G05F 1/46* (2006.01)
*G11C 11/406* (2006.01)

(52) U.S. Cl.
CPC .......... *G05F 1/465* (2013.01); *G11C 11/40626* (2013.01)
USPC ......................................... 327/512; 327/513

(58) Field of Classification Search
USPC .................................. 327/512, 513
See application file for complete search history.

(56) References Cited

U.S. PATENT DOCUMENTS

| | | | | |
|---|---|---|---|---|
| 5,039,878 | A * | 8/1991 | Armstrong et al. | 327/512 |
| 6,882,213 | B2 * | 4/2005 | Kim | 327/512 |
| 6,921,199 | B2 * | 7/2005 | Aota et al. | 374/178 |
| 7,579,898 | B2 * | 8/2009 | Soldera et al. | 327/512 |
| 2009/0079470 | A1 | 3/2009 | Bi | |

FOREIGN PATENT DOCUMENTS

KR 1020100061900 A 6/2010

* cited by examiner

*Primary Examiner* — Patrick O'Neill
(74) *Attorney, Agent, or Firm* — William Park & Associates Patent Ltd.

(57) ABSTRACT

Temperature sensors are provided. The temperature sensor includes a comparison voltage generator and a temperature voltage generator. The comparison voltage generator generates a first comparison voltage signal whose level varies according to temperature variation and a second comparison voltage signal whose level is constant regardless of temperature variation. The temperature voltage generator generates a first internal current signal whose level varies according to a level of the first comparison voltage signal and a second internal current signal whose level varies according to a level of the second comparison voltage signal. Further, the temperature voltage generator amplifies a current difference between the first and second internal current signals to generate a temperature voltage signal.

20 Claims, 4 Drawing Sheets

TEMPERATURE SENSORS

CROSS-REFERENCE TO RELATED APPLICATION

The present application claims priority under 35 U.S.C. 119(a) to Korean Application No. 10-2013-0116212, filed on Sep. 30, 2013, in the Korean Intellectual Property Office, which is incorporated herein by reference in its entirety as set forth in full.

BACKGROUND

1. Technical Field

Embodiments of the present disclosure relate to a semiconductor integrated circuit and more particularly temperature sensors of the semiconductor integrated circuit.

2. Related Art

In the electronics industry, highly integrated fast volatile memory devices such as high performance dynamic random access memory (DRAM) devices widely used as memory devices are increasingly in demand with the development of higher performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of efforts have been focused on reduction of an operating current and a standby current of the semiconductor devices.

A data retention characteristic of one cell of the DRAM device including a single transistor and a single storage capacitor may be very sensitive to a temperature. Thus, it may be necessary to control operation conditions of internal circuit blocks in the semiconductor devices according to variation of circumferential temperature. For example, the DRAM devices employed in mobile systems may be designed to control a refresh cycle time according to variation of circumferential temperature. Temperature sensors such as digital temperature sensor regulators (DTSRs) or analog temperature sensor regulators (ATSRs) have been widely used to control the operation conditions of the semiconductor devices such as the DRAM devices according to variation of circumferential temperature. These temperature sensors may detect a relatively high temperature and may control an operation cycle time to reduce power consumption in a self-refresh mode. Further, the temperature sensors may monitor a circumferential temperature in a normal operation mode.

SUMMARY

According to an embodiment, a temperature sensor includes a comparison voltage generator and a temperature voltage generator. The comparison voltage generator generates a first comparison voltage signal whose level varies according to temperature variation and a second comparison voltage signal whose level is constant regardless of temperature variation. The temperature voltage generator generates a first internal current signal whose level varies according to a level of the first comparison voltage signal and a second internal current signal whose level varies according to a level of the second comparison voltage signal. Further, the temperature voltage generator amplifies a current difference between the first and second internal current signals to generate a temperature voltage signal.

According to an embodiment, a temperature sensor includes a first comparison unit suitable for comparing a first division voltage signal with a first comparison voltage signal whose level varies according to temperature variation to generate a first pull-up signal and suitable for generating a first internal current signal corresponding to a level of the first comparison voltage signal, a second comparison unit suitable for comparing a second division voltage signal with a second comparison voltage signal whose level is constant regardless of temperature variation to generate a second pull-up signal and suitable for generating a second internal current signal corresponding to a level of the second comparison voltage signal, and an amplification unit suitable for amplifying a difference between a level of the first internal current signal and a level of the second internal current signal in response to the first and second pull-up signals to generate a temperature voltage signal.

BRIEF DESCRIPTION OF THE DRAWINGS

Embodiments of the present invention will become more apparent in view of the attached drawings and accompanying detailed descriptions, in which.

DETAILED DESCRIPTION OF THE EMBODIMENTS

Various embodiments of the present invention will be described hereinafter with reference to the accompanying drawings. However, the embodiments described herein are for illustrative purposes only and are not intended to limit the scope of the present invention.

Figure 1:
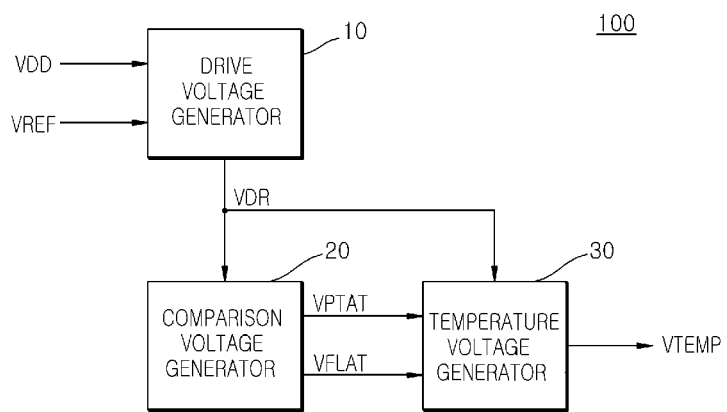
FIG. 1 is a block diagram illustrating a temperature sensor according to an embodiment of the present invention.

Referring to FIG. 1, a temperature sensor 100 may include a drive voltage generator 10, a comparison voltage generator 20 and a temperature voltage generator 30.

The drive voltage generator 10 may be configured to receive a power supply voltage signal VDD and a reference voltage signal VREF and generate a drive voltage signal VDR that is obtained by lowering a level of a power supply voltage signal VDD. The drive voltage signal VDR may be generated to have a constant voltage level regardless of temperature variation.

The comparison voltage generator 20 may be configured to receive the drive voltage signal VDR and generate a first comparison voltage signal VPTAT having a level being dependent on a temperature and a second comparison voltage signal VFLAT having a level being constant regardless of temperature variation.

The temperature voltage generator 30 may be configured to receive the drive voltage signal VDR, the first comparison voltage signal VPTAT and the second comparison voltage signal VFLAT and generate a temperature voltage signal VTEMP.

Figure 2:
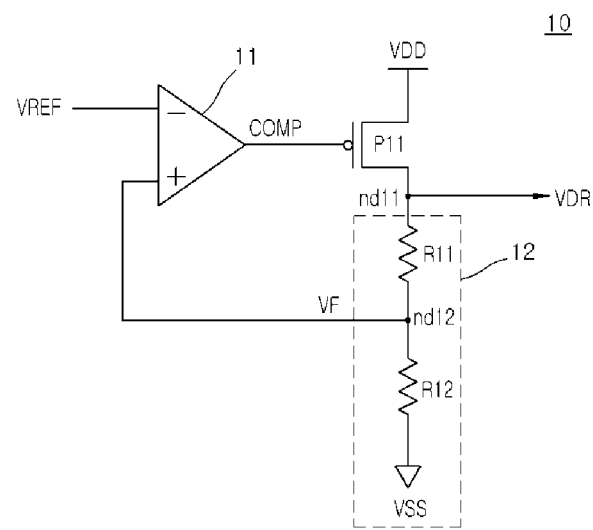
FIG. 2 is a circuit diagram illustrating a drive voltage generator included in the temperature sensor of FIG. 1.

Referring to FIG. 2, the drive voltage generator 10 may include a comparator 11, a driving element P11, a voltage divider 12.

The comparator 11 may be configured to compare a feedback voltage signal VF obtained by dividing a level of the drive voltage signal VDR with a reference voltage signal VREF to generate a comparison signal COMP. The driving element P11 may be a PMOS transistor. The driving element P11 may be electrically coupled between a power supply voltage signal VDD terminal and a node ND11. The driving element P11 may be turned on to pull up the drive voltage signal VDR outputted through the node ND11 when the comparison signal COMP is enabled. The voltage divider 12 may be electrically coupled between the node ND11 and a ground voltage VSS terminal. The voltage divider 12 may include a resistor R11 coupled between the node ND11 and a node ND12 and a resistor R12 coupled between the node ND12 and the ground voltage VSS terminal. The voltage divider 12 may divide a level of the drive voltage signal VDR according to resistance ratio of the resistors R11 and R12 to output the feed-back voltage signal VF through the node ND12. That is, the drive voltage generator 10 may pull up the drive voltage signal VDR to a level of the power supply voltage signal VDD when a level of the feed-back voltage signal VF generated from the drive voltage signal VDR is lower than a level of the reference voltage signal VREF.

Figure 3:
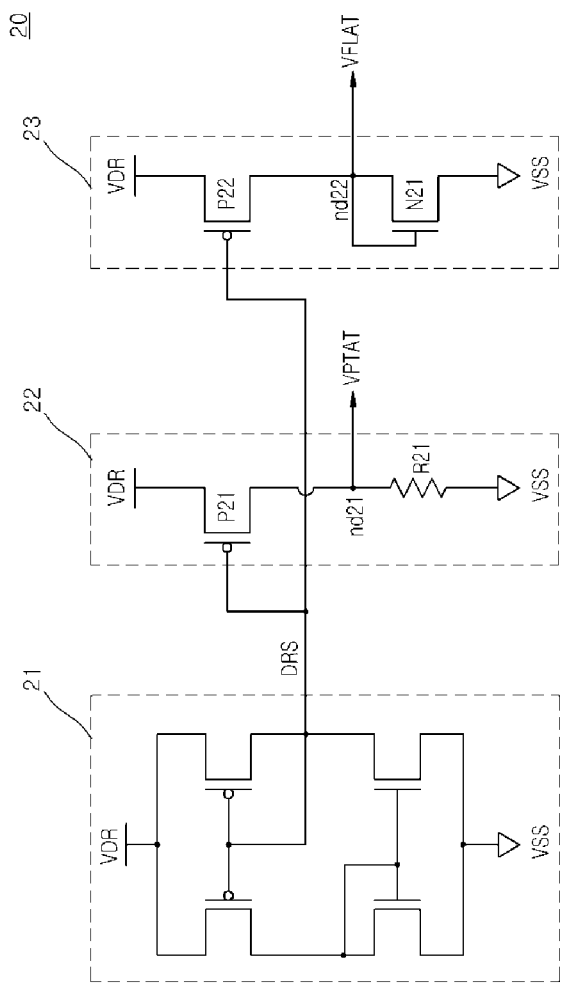
FIG. 3 is a circuit diagram illustrating a comparison voltage generator included in the temperature sensor of FIG. 1.

Referring to FIG. 3, the comparison voltage generator 20 may include a drive signal generator 21, a first driver 22 and a second driver 23.

The drive signal generator 21 may be configured to receive the drive voltage signal VDR and generate a drive signal DRS having a constant level regardless of temperature variation. The drive signal generator 21 may be realized using a conventional band gap voltage generation circuit or a conventional Widlar voltage generation circuit that generates a constant voltage level regardless of temperature variation.

The first driver 22 may include a driving element P21 and a resistor R21. The driving element P21 may be a PMOS transistor. The driving element P21 may be electrically coupled between the node ND11 (see FIG. 2) outputting the drive voltage signal VDR and a node ND21. The driving element P21 may pull up the first comparison voltage signal VPTAT outputted through the node ND21 according to a level of the drive signal DRS. The resistor R21 coupled between the node ND21 and the ground voltage signal VSS terminal. A resistance value of the resistor R21 may vary according to temperature variation. That is, the first driver 22 may generate the first comparison voltage signal VPTAT whose level varies according to temperature variation due to a temperature-dependent characteristic of the resistor R21.

The second driver 23 may include a driving element P22 and a diode element N21. The driving element P22 may be a PMOS transistor, and may be electrically coupled between the node ND11 (see FIG. 2) outputting the drive voltage signal VDR and a node ND22. The driving element P22 may pull up the second comparison voltage signal VFLAT outputted through the node ND22 according to a level of the drive signal DRS. The diode element N21 may be a NMOS transistor and may generate a constant current regardless of temperature variation because a gate of the diode element N21 may be electrically connected to the node ND22. That is, the second driver 23 may generate the second comparison voltage signal VFLAT whose level is constant regardless of temperature variation due to a temperature characteristic of the diode element N21.

Figure 4:
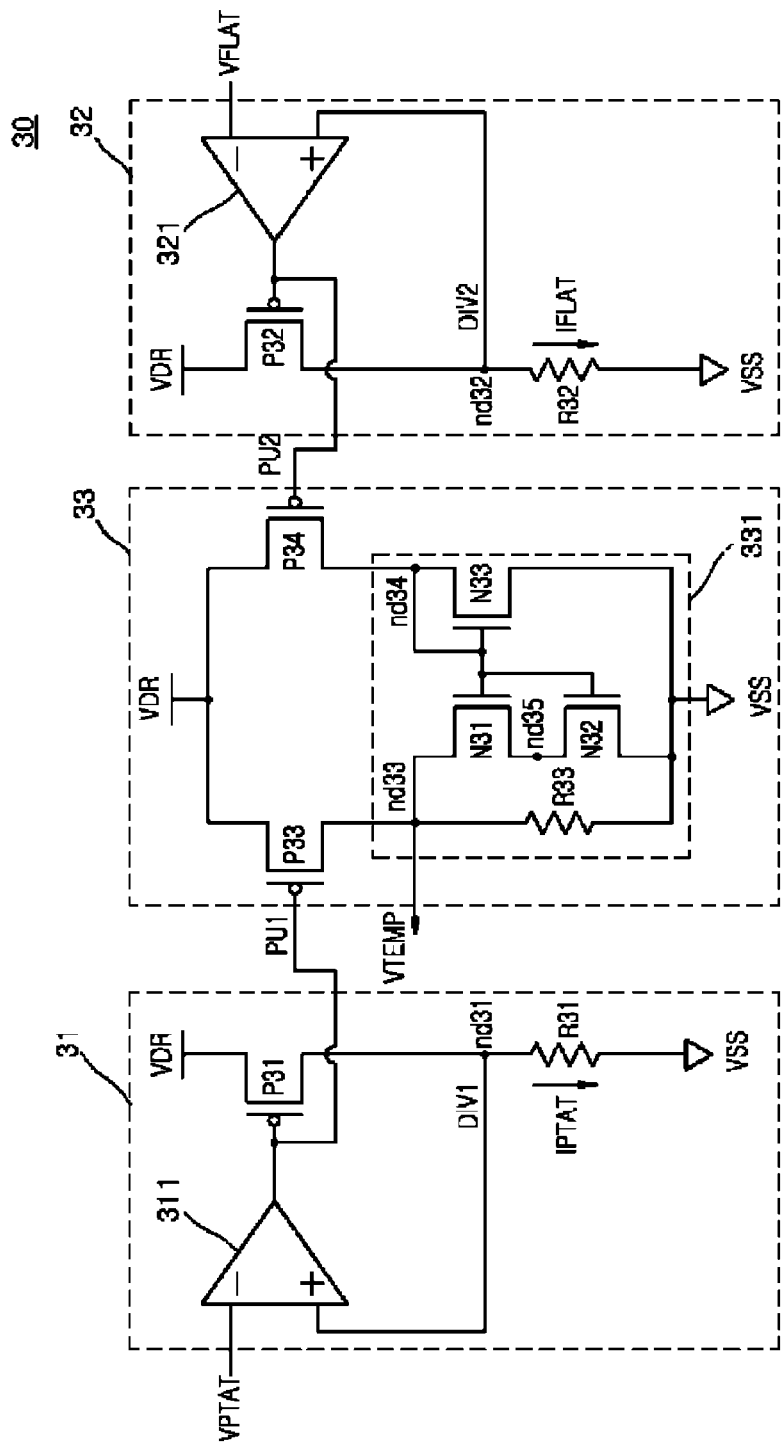
FIG. 4 is a circuit diagram illustrating a temperature voltage generator included in the temperature sensor of FIG. 1.

Referring to FIG. 4, the temperature voltage generator 30 may include a first comparison unit 31, a second comparison unit 32 and an amplification unit 33.

The first comparison unit 31 may include a comparator 311, a driving unit P31 coupled between the node ND11 (see FIG. 2) outputting the drive voltage signal VDR and a node ND31, and a resistor R31 coupled between the node ND31 and the ground voltage VSS terminal. The comparator 311 may compare a first division voltage signal DIV1 with the first comparison voltage signal VPTAT to generate a first pull-up signal PU1. The driving unit P31 may be a PMOS transistor, and may drive the first division voltage signal DIV1 outputted through the node ND31 according to a level of the first pull-up signal PU1. The resistor R31 may generate the first division voltage signal DIV1 whose level is determined according to an amount of a current flowing through the node ND31. That is, the first comparison unit 31 may drive the node ND31 according to a level of the first pull-up signal PU1 which is determined by a level of the first comparison voltage signal VPTAT to generate the first internal current signal IPTAT flowing through the resistor R31. The first internal current signal IPTAT whose current level is controlled according to a level of the first comparison voltage signal VPTAT may be expressed by the following equation 1.

$$IPTAT = \frac{VPTAT}{R31} \quad \text{(Equation 1)}$$

In the equation 1, "R31" denotes a resistance value of the resistor R31.

As can be seen from the equation 1, a current level of the first internal current signal IPTAT may be obtained by dividing a voltage level of the first comparison voltage signal VPTAT into a resistance value of the resistor R31.

The second comparison unit 32 may include a comparator 321, a driving element P32 and a resistor R32. The driving element of the comparison unit 32 may be also a PMOS transistor. The driving element P32 may be coupled between the node ND11 (see FIG. 2) outputting the drive voltage signal VDR and a node ND32.

The resistor R32 may be coupled between the node ND32 and the ground voltage VSS terminal. The comparator 321 may compare a second division voltage signal DIV2 with the second comparison voltage signal VFLAT to generate a second pull-up signal PU2. The driving element P32 may drive the second division voltage signal DIV2 outputted through the node ND32 according to a level of the second pull-up signal PU2. The resistor R32 may generate the second division voltage signal DIV2 whose level is determined according to an amount of a current flowing through the node ND32. That is, the second comparison unit 32 may drive the node ND32 according to a level of the second pull-up signal PU2 which is determined by a level of the second comparison voltage signal VFLAT to generate the second internal current signal IFLAT flowing through the resistor R32. The second internal current signal IFLAT whose current level is controlled according to a level of the second comparison voltage signal VFLAT may be expressed by the following equation 2.

$$IFLAT = \frac{VFLAT}{R32} \quad \text{(Equation 2)}$$

In the equation 2, "R32" denotes a resistance value of the resistor R32.

As can be seen from the equation 2, a current level of the second internal current signal IFLAT may be obtained by dividing a voltage level of the second comparison voltage signal VFLAT into a resistance value of the resistor R32.

The amplification unit 33 may include a first driving element P33 coupled between the node ND11 (see FIG. 2) outputting the drive voltage signal VDR and a node ND33, a second driving element P34 coupled between the node ND11 (see FIG. 2) outputting the drive voltage signal VDR and a node ND34, and a current controller 331 coupled between the nodes ND33 and ND34 and the ground voltage VSS terminal. The first and second driving element P33 and P34 may be a PMOS transistor. The first driving element P33 may drive the temperature voltage signal VTEMP outputted through the node ND33 according to a level of the first pull-up signal PU1. The second driving element P34 may drive the node ND34 according to a level of the second pull-up signal PU2. The current controller 331 may amplify a difference between an amount of current flowing through the node ND33 and an amount of current flowing through the node ND34 to generate the temperature voltage signal VTEMP.

In more detail, the current controller 331 may include an third driving element N31 coupled between the node ND33 and a node ND35, an fourth driving element N32 coupled between the node ND35 and the ground voltage signal VSS terminal, an fifth driving element N33 coupled between the node ND34 and the ground voltage signal VSS terminal, and an internal resistor R33 coupled between the node ND33 and the ground voltage signal VSS terminal. The third to fifth driving element N31 to N33 may be NMOS transistor. Gates of the third driving element N31, the fourth driving element N32 and the fifth driving element N33 may be electrically connected to the node ND34 in common. That is, the current controller 331 may extract an amount of current flowing through the node ND34 driven by a level of the second pull-up signal PU2 from an amount of current flowing through the node ND33 driven by a level of the first pull-up signal PU1. The current controller 331 may generate the temperature voltage signal VTEMP having a voltage level that corresponds to a voltage drop of the internal resistor R33 through which the abstracted current flows. Thus, a level of the temperature voltage signal VTEMP may be controlled by a resistance value of the internal resistor R33. Further, the fourth driving element N32 may be used as variable resistor that sets the node ND35 to have a voltage level which is higher than the ground voltage signal VSS. As a result, the third driving element N31 may operate in a saturation region.

An equation of the temperature voltage signal VTEMP generated in the temperature voltage generator 30 having the aforementioned configuration will be described hereinafter as a function of the first and second internal current signals IPTAT and IFLAT expressed by the equations 1 and 2. That is, the temperature voltage signal VTEMP, which is obtained by amplifying a difference value between current levels of the first and second internal current signals IPTAT and IFLAT with the internal resistor R33, may be expressed by the following equation 3.

$$VTEMP = R33(IPTAT - IFLAT) \quad \text{(Equation 3)}$$

In the equation 3, "R33" denotes a resistance value of the internal resistor R33. If the equations 1 and 2 are substituted into the equation 3, the temperature voltage signal VTEMP may be rewritten as the following equation 4.

$$VTEMP = R33((VPTAT/R31) - (VFLAT/R32)) \quad \text{(Equation 4)}$$

As can be seen from the equations 3 and 4, it may be understood that the temperature voltage signal VTEMP is obtained by amplifying a difference value between a current level of the first internal current signal IPTAT generated from the first comparison voltage signal VPTAT and a current level of the second internal current signal IFLAT generated from the second comparison voltage signal VFLAT using the internal resistor R33.

As described above, the temperature sensor according to the embodiments may convert the first comparison voltage signal VPTAT whose level varies according to temperature variation into the first internal current signal IPTAT and may convert the second comparison voltage signal VFLAT whose level has a constant value regardless of temperature variation into the second internal current signal IFLAT. Further, the temperature sensor according to the embodiments may generate the temperature voltage signal VTEMP by amplifying a current difference between the first internal current signal IPTAT and the second internal current signal IFLAT using the internal resistor R33. Thus, a level variation of the temperature voltage signal VTEMP whose level varies according to temperature variation may be appropriately controlled by a resistance value of the internal resistor R33.

While certain embodiments have been described above, it will be understood to those skilled in the art that the embodiments described are by way of example only. Accordingly, the semiconductor memory apparatus and the data input and output method thereof described herein should not be limited based on the described embodiments. Rather, the semiconductor memory apparatus and the data input and output method thereof described herein should only be limited in light of the claims that follow when taken in conjunction with the above description and accompanying drawings.

What is claimed is:

1. A temperature sensor comprising:
   a comparison voltage generator configured to generate a first comparison voltage signal whose level varies according to a temperature variation and a second comparison voltage signal whose level is constant regardless of temperature variation; and
   a temperature voltage generator configured to generate a first internal current signal whose level varies according to a level of the first comparison voltage signal and a second internal current signal whose level varies according to a level of the second comparison voltage signal and amplify a current difference between the first and second internal current signals to generate a temperature voltage signal.

2. The temperature sensor of claim 1, wherein the temperature voltage signal is obtained by a resistance of an internal resistor and a current corresponding to the level difference between the first and second internal current signals which flows in the internal resistor.

3. The temperature sensor of claim 1, wherein the comparison voltage generator is configured to generate the first comparison voltage signal by dividing a level of a drive voltage signal with a first resistor whose resistance value varies according to temperature variation.

4. The temperature sensor of claim 1, wherein comparison voltage generator is configured to generate the second comparison voltage signal by lowering a level of a drive voltage signal to a voltage level generated by a diode through which a constant current flows regardless of temperature variation.

5. The temperature sensor of claim 1, wherein the comparison voltage generator includes:
   a drive signal generator configured to generate a drive signal having a constant level regardless of temperature variation;
   a first driver configured to lower a level of a drive voltage signal according to a resistance value of a first resistor in response to the drive signal to generate the first comparison voltage signal; and
   a second driver configured to lower a level of the drive voltage signal to a voltage level corresponding to a current flowing through a diode having a temperature-independent characteristic in response to the drive signal to generate the second comparison voltage signal.

6. The temperature sensor of claim 1, wherein the temperature voltage generator includes:
- a first comparison unit configured to compare a first division voltage signal with the first comparison voltage signal to generate a first pull-up signal and generate the first internal current signal corresponding to a level of the first comparison voltage signal;
- a second comparison unit configured to compare a second division voltage signal with the second comparison voltage signal to generate a second pull-up signal and generate the second internal current signal corresponding to a level of the second comparison voltage signal; and
- an amplification unit configured to amplify a difference between a level of the first internal current signal and a level of the second internal current signal in response to the first and second pull-up signals to generate the temperature voltage signal,
- wherein the difference between the levels of the first and second internal current signals is amplified to have a voltage level corresponding to a voltage drop of an internal resistor.

7. The temperature sensor of claim 6, wherein the first comparison unit includes:
- a first comparator configured to compare the first division voltage signal whose level is controlled according to a level of the first internal current signal with the first comparison voltage signal to generate the first pull-up signal;
- a first driving element configured to electrically couple between a drive voltage signal terminal and a first node and pull up a voltage of the first node in response to the first pull-up signal; and
- a second resistor configured to electrically couple between the first node and a ground voltage signal terminal and generate the first division voltage signal whose level is determined according to a level of the first internal current signal flowing through the first node.

8. The temperature sensor of claim 6, wherein the second comparison unit includes:
- a second comparator configured to compare the second division voltage signal whose level is controlled according to a level of the second internal current signal with the second comparison voltage signal to generate the second pull-up signal;
- a second driving element configured to electrically couple between a drive voltage signal terminal and a second node and pull up the second node in response to the second pull-up signal; and
- a third resistor configured to electrically couple between the second node and a ground voltage signal terminal and configured to generate the second division voltage signal whose level is determined according to a level of the second internal current signal flowing through the second node.

9. The temperature sensor of claim 6, wherein the amplification unit includes:
- a third driving element configured to electrically couple between a drive voltage signal terminal and a third node and receive the first pull-up signal to pull up the temperature voltage signal outputted through the third node;
- a fourth driving element configured to electrically couple between the drive voltage signal terminal and a fourth node and configured to receive the second pull-up signal to pull up the fourth node; and
- a current controller configured to amplify a difference between an amount of current flowing through the third node and an amount of current flowing through the fourth node to generate the temperature voltage signal,
- wherein the current flowing through the third node is controlled by the first internal current signal, and
- wherein the current flowing through the fourth node is controlled by the second internal current signal.

10. The temperature sensor of claim 9, wherein the current controller includes:
- a fifth driving element configured to electrically couple between the third node and a fifth node;
- a sixth driving element configured to electrically couple between the fifth node and a ground voltage signal terminal; and
- a seventh driving element configured to couple between the fourth node and the ground voltage signal terminal;
- wherein the internal resistor is configured to electrically couple between the third node and the ground voltage signal terminal and generate the temperature voltage signal according to an amount of current flowing through the third node and
- wherein inputs of the fifth to seventh driving elements are electrically coupled to the fourth node in common.

11. The temperature sensor of claim 1, further comprising a drive voltage generator configured to compare a feed-back voltage signal with a reference voltage signal to generate a drive voltage signal,
- wherein the drive voltage signal is obtained by lowering a level of a power supply voltage signal.

12. The temperature sensor of claim 11, wherein the drive voltage generator includes:
- a third comparator configured to compare the feed-back voltage signal with the reference voltage signal to generate a comparison signal;
- a pull-up element configured to electrically couple between a power supply voltage signal terminal and a sixth node and be turned on in response to the comparison signal to pull up the sixth node through which the drive voltage signal is outputted; and
- a voltage divider configured to electrically couple between the sixth node and a ground voltage signal terminal and configured to divide a level of the drive voltage signal to generate the feed-back voltage signal.

13. A temperature sensor comprising:
- a first comparison unit configured to compare a first division voltage signal with a first comparison voltage signal whose level varies according to temperature variation to generate a first pull-up signal and generate a first internal current signal corresponding to a level of the first comparison voltage signal;
- a second comparison unit configured to compare a second division voltage signal with a second comparison voltage signal whose level is constant regardless of temperature variation to generate a second pull-up signal and configured to generate a second internal current signal corresponding to a level of the second comparison voltage signal; and
- an amplification unit configured to amplify a difference between a level of the first internal current signal and a level of the second internal current signal in response to the first and second pull-up signals to generate a temperature voltage signal.

14. The temperature sensor of claim 13, wherein the temperature voltage signal is obtained by a resistance of an internal resistor and a current corresponding to a level difference between the first and second internal current signals which flows in the internal resistor.

15. The temperature sensor of claim 13, wherein the first comparison unit is configured to generate the first comparison voltage signal by dividing a level of a drive voltage signal with a resistor whose resistance value varies according to temperature variation.

16. The temperature sensor of claim 13, wherein the second comparison unit is configured to generate the second comparison voltage signal by lowering a level of a drive voltage signal to a voltage level generated by a diode through which a constant current flows regardless of temperature variation.

17. The temperature sensor of claim 13, wherein the first comparison unit includes:
- a first comparator configured to compare the first division voltage signal whose level is controlled according to a level of the first internal current signal with the first comparison voltage signal to generate the first pull-up signal;
- a first driving element configured to electrically couple between a drive voltage signal terminal and a first node and pull up the first node in response to the first pull-up signal; and
- a first resistor configured to electrically coupled between the first node and a ground voltage signal terminal and generate the first division voltage signal whose level is determined according to a level of the first internal current signal flowing through the first node.

18. The temperature sensor of claim 13, wherein the second comparison unit includes:
- a second comparator configured to compare the second division voltage signal whose level is controlled according to a level of the second internal current signal with the second comparison voltage signal to generate the second pull-up signal;
- a second driving element configured to electrically coupled between a drive voltage signal terminal and a second node and pull up the second node in response to the second pull-up signal; and
- a second resistor configured to electrically couple between the second node and a ground voltage signal terminal and generate the second division voltage signal whose level is determined according to a level of the second internal current signal flowing through the second node.

19. The temperature sensor of claim 13, wherein the amplification unit includes:
- a third driving element configured to electrically couple between a drive voltage signal terminal and a third node and receive the first pull-up signal to pull up the temperature voltage signal outputted through the third node;
- a fourth driving element configured to electrically couple between the drive voltage signal terminal and a fourth node and receive the second pull-up signal to pull up the fourth node; and
- a current controller configured to amplify a difference between an amount of current flowing through the third node and an amount of current flowing through the fourth node to generate the temperature voltage signal,
- wherein the current flowing through the third node is controlled by the first internal current signal,
- wherein the current flowing through the fourth node is controlled by the second internal current signal, and
- wherein the difference between the first and second internal current signals is amplified to have a voltage level corresponding to a voltage drop of an internal resistor.

20. The temperature sensor of claim 19, wherein the current controller includes:
- a fifth driving element configured to electrically couple between the third node and a fifth node;
- a sixth driving element configured to electrically couple between the fifth node and a ground voltage signal terminal; and
- a seventh drive element configured to electrically couple between the fourth node and the ground voltage signal terminal;
- wherein the internal resistor is configured to electrically couple between the third node and the ground voltage signal terminal and generate the temperature voltage signal according to an amount of current flowing through the third node and
- wherein inputs of the fifth to seventh driving elements are electrically coupled to the fourth node in common.

* * * * *